(12) United States Patent
Choi et al.

(10) Patent No.: US 9,753,106 B2
(45) Date of Patent: Sep. 5, 2017

(54) WIRELESS RADIO FREQUENCY COIL FOR MAGNETIC RESONANCE IMAGING, METHOD OF CONTROLLING THE COIL, AND MAGNETIC RESONANCE IMAGING APPARATUS USING THE COIL

(75) Inventors: Seung Je Choi, Suwon-si (KR); Young Cheol Kwon, Hwaseong-si (KR); Jin Young Hwang, Busan (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 981 days.

(21) Appl. No.: 13/619,663

(22) Filed: Sep. 14, 2012

(65) Prior Publication Data

US 2013/0119981 A1    May 16, 2013

(30) Foreign Application Priority Data

Nov. 10, 2011 (KR) .................. 10-2011-0116979

(51) Int. Cl.
*G01R 33/341* (2006.01)
*G01R 33/54* (2006.01)
*G01R 33/36* (2006.01)

(52) U.S. Cl.
CPC ......... *G01R 33/3692* (2013.01); *G01R 33/36* (2013.01)

(58) Field of Classification Search
CPC ............ G01R 33/3692; G01R 33/3415; G01R 33/3621; G01R 33/341; G01R 33/3664; G01R 33/36; G01R 33/34046
USPC .......... 324/307, 309, 318–322; 600/407–422
See application file for complete search history.

(56) References Cited

U.S. PATENT DOCUMENTS

| 6,980,848 | B2 * | 12/2005 | Helfer ..................... A61B 5/055 600/423 |
| 7,369,898 | B1 * | 5/2008 | Kroll et al. ...................... 607/63 |
| 2006/0226841 | A1 * | 10/2006 | Boskamp et al. ............ 324/322 |
| 2007/0265685 | A1 * | 11/2007 | Zeijlemaker ......... A61B 5/0031 607/60 |
| 2008/0272786 | A1 * | 11/2008 | Luedeke et al. .............. 324/322 |
| 2009/0058420 | A1 * | 3/2009 | Adachi et al. ................ 324/322 |
| 2010/0060284 | A1 * | 3/2010 | Sugiura ......................... 324/318 |
| 2011/0152672 | A1 * | 6/2011 | Doerr et al. ................... 600/421 |
| 2012/0062230 | A1 * | 3/2012 | Vaughan et al. .............. 324/318 |
| 2014/0066753 | A1 * | 3/2014 | Qian .................. G01R 33/3621 600/421 |

OTHER PUBLICATIONS

Communication dated Dec. 26, 2016, issued by the State Intellectual Property Office of P.R. China in counterpart Chinese Application No. 201210447589.0.

* cited by examiner

*Primary Examiner* — Melissa Koval
*Assistant Examiner* — Rishi Patel
(74) *Attorney, Agent, or Firm* — Sughrue Mion, PLLC

(57) ABSTRACT

A wireless radio frequency coil for magnetic resonance imaging (MRI) is provided. The wireless radio frequency coil including a wireless radio frequency coil unit configured to transmit, receive or transmit and receive a radio frequency signal; a power supply configured to provide a power voltage for operation of the wireless radio frequency coil unit; a switch connected to the power supply and the wireless radio frequency coil unit; a sensor configured to detect signals discharged from a space in which the wireless radio frequency coil unit is located; and a controller configured to provide or shut off the power voltage to the wireless radio frequency coil unit by controlling the switch according to a result obtained from the sensor.

32 Claims, 7 Drawing Sheets

WIRELESS RADIO FREQUENCY COIL FOR MAGNETIC RESONANCE IMAGING, METHOD OF CONTROLLING THE COIL, AND MAGNETIC RESONANCE IMAGING APPARATUS USING THE COIL

CROSS-REFERENCE TO RELATED APPLICATION

This application claims priority from Korean Patent Application No. 2011-0116979, filed on Nov. 10, 2011 in the Korean Intellectual Property Office, the disclosure of which is herein incorporated by reference.

BACKGROUND

1. Field

Devices, apparatuses, articles of manufacture, and methods consistent with exemplary embodiments relate to a wireless radio frequency coil in an interior space of a gantry of a magnetic resonance imaging apparatus, a method of controlling power for the coil, and a magnetic resonance imaging apparatus using the coil.

2. Description of the Related Art

Magnetic resonance imaging (MRI) is an imaging technology that uses magnetic fields to obtain internal images of a human body, and processes images obtained by using interaction of atomic nuclei of a hydrogen atom in relation to a magnetic field and radio frequencies inside a human body. Therefore, in general, a radio frequency coil is used to provide a radio frequency pulse.

Also, in general, switching is used to provide a power voltage to operate the radio frequency coil. However, there is a disadvantage in that the power must be switched on and off by a user at every occasion a radio frequency coil is intended to be used. Also, in case that a user forgets to switch on the radio frequency coil, no MRI is obtained, since there is no power.

SUMMARY

Exemplary embodiments provide a wireless radio frequency coil for a magnetic resonance imaging (MRI), a method of controlling a power of the coil and a magnetic resonance imaging apparatus using the coil, capable of detecting signals discharged from a space in which a radio frequency coil is located so that the wireless radio frequency coil is automatically turned on or off.

According to an aspect of an exemplary embodiment, there is provided a wireless radio frequency coil for magnetic resonance imaging (MRI) that includes a wireless radio frequency coil unit configured to transmit, receive or transmit and receive a radio frequency signal; a power supply unit configured to provide a power voltage for operation of the wireless radio frequency coil unit; a switch connected to the power supply unit and the wireless radio frequency coil unit; a sensor unit configured to detect signals discharged from a space in which the wireless radio frequency coil unit is located; and a control unit configured to provide or shut off the power voltage to the wireless radio frequency coil unit by controlling the switch according to a result obtained from the sensor unit.

The sensor unit may be provided with an optical sensor that detects optical signals.

The sensor unit may detect a laser that is emitted from a laser transmission unit located in an interior space of a gantry of an MRI apparatus.

The control unit may control the switch by determining whether an intensity of a laser detected by the sensor unit is equal to or greater than a threshold value.

The sensor unit may be provided with a magnetic sensor that detects magnetic fields.

The sensor unit may detect a main magnetic field that is generated by a main magnet located in an interior space of a gantry of an MRI apparatus.

The control unit may control the switch by determining whether an intensity of the main magnetic field detected by the sensor unit is greater than a threshold value.

The sensor unit may detect a slanted magnetic field generated by a gradient coil located in an interior space of a gantry of an MRI apparatus.

The control unit may control the switch according to an average value of intensities of slanted magnetic fields detected by the sensor unit during a period of time.

The control unit may control the switch by determining whether the average value of the intensities of the slanted magnetic fields is equal to or greater than a threshold value.

The sensor unit may detect a magnetic field component of a radio frequency pulse transmitted from a radio frequency coil located in an interior space of a gantry of an MRI apparatus.

The control unit may control the switch by determining whether the intensity of the magnetic field component of the radio frequency pulse detected by the sensor unit is equal to or greater than a threshold value.

The wireless radio frequency coil may further include a display unit configured to display a status of the power voltage provided to the wireless radio frequency coil unit.

The wireless radio frequency coil may further include a power control unit which is connected between the wireless radio frequency coil unit and the power supply unit to control the power voltage provided from the power supply unit at a steady rate and to provide the controlled power voltage to the wireless frequency coil unit.

According to an aspect of another exemplary embodiment, there is provided a method of controlling a power of a wireless radio frequency coil for magnetic resonance imaging (MRI) that includes a wireless radio frequency coil unit configured to transmit, receive or transmit and receive a radio frequency signal, a power supply unit configured to provide a power voltage for operation of the wireless radio frequency coil unit, a switch connected to the power supply unit and the wireless radio frequency coil unit, and a sensor unit configured to detect signals discharged from a space in which the wireless radio frequency coil unit is located, the method comprising detecting signals discharged from a space in which the wireless radio frequency coil unit is located; and providing or shutting off the power voltage for operation of the wireless radio frequency coil unit by controlling the switch according to a result obtained from the sensor unit.

In the detecting of the signals, a laser may be detected through an optical sensor that is configured to detect optical signals.

In the detecting of the signals, a laser, which is emitted from a laser transmission unit located in an interior space of a gantry of a magnetic resonance imaging (MRI) apparatus, may be detected.

In the providing or shutting off the power voltage for operation of the wireless radio frequency coil unit, the switch may be controlled by determining whether an intensity of the detected laser is equal to or greater than a threshold value.

In the detecting of the signals, a magnetic field may be detected through a magnetic sensor that is configured to detect magnetic fields.

In the detecting of the signals, a main magnetic field, which is generated by a main magnet located in an interior space of a gantry of a magnetic resonance imaging (MRI) apparatus may be detected.

In the providing or shutting off the power voltage for operation of the wireless radio frequency coil unit, the switch may be controlled by determining whether an intensity of the detected main magnetic field is equal to or greater than a threshold value.

In the detecting of the signals, a slanted magnetic field, which is generated by a gradient coil located in an interior space of a gantry of a magnetic resonance imaging (MRI) apparatus, may be detected.

In the providing or shutting off the power voltage for operation of the wireless radio frequency coil unit, the switch may be controlled according to an average value of intensities of slanted magnetic fields detected during a period of time.

In the providing or shutting off the power voltage required for operation of the wireless radio frequency coil unit, the switch may be controlled by determining whether the average value of the intensities of the slanted magnetic fields is equal to or greater than a threshold value.

In the detecting of the signals, a magnetic field component of a radio frequency pulse transmitted from a radio frequency coil located in an interior space of a gantry of a magnetic resonance imaging (MRI) apparatus may be detected.

In the providing or shutting off the power voltage for operation of the wireless radio frequency coil unit, the switch may be controlled by determining whether an intensity of the detected magnetic field component of the radio frequency pulse is equal to or greater than a threshold value.

The method may further include displaying a status of the power voltage provided to the wireless radio frequency coil unit.

According to an aspect of another exemplary embodiment, there is provided a magnetic resonance imaging (MRI) apparatus that includes a wireless radio frequency coil comprising a wireless radio frequency coil unit configured to transmit, receive or transmit and receive a radio frequency signal, a power supply unit configured to provide a power voltage for operation of the wireless radio frequency coil unit, a switch connected to the power supply unit and the wireless radio frequency coil unit, a sensor unit configured to detect signals discharged from a space in which the wireless radio frequency coil unit is located; and a control unit configured to provide or shut off the power voltage by controlling the switch according to a result obtained from the sensor unit; a computer system configured to form a magnetic resonance image based on a radio frequency signal which is received by the wireless radio frequency coil; and an output unit configured to output the magnetic resonance image formed by the computer system and information about an operation of the MRI apparatus.

BRIEF DESCRIPTION OF THE DRAWINGS

These above and/or other aspects will become apparent and more readily appreciated from the following description of exemplary embodiments, taken in conjunction with the accompanying drawings of which.

DETAILED DESCRIPTION

Figure 1:
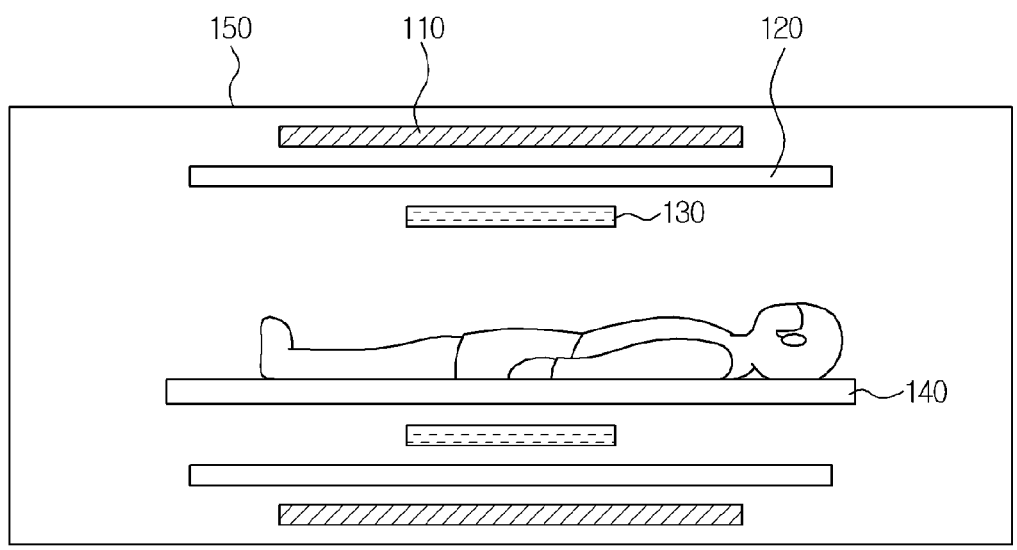
FIG. 1 is a cross-sectional view schematically illustrating an MRI apparatus according to an exemplary embodiment.

Reference will now be made in detail to the exemplary embodiments of the present disclosure, examples of which are illustrated in the accompanying drawings, wherein like reference numerals refer to like elements throughout.

FIG. 1 is a cross-sectional view schematically illustrating an MRI apparatus according to an exemplary embodiment.

Referring to FIG. 1, an MRI apparatus includes a main magnet 110 that generates a main magnetic field, a gradient coil 120 that generates a slanted magnetic field, and a radio frequency (RF) coil 130 that transmits a radio frequency pulse.

The main magnet 110 is configured to generate a strong magnetic field used in the MRI apparatus, and three methods are used in generating the magnetic field: first method is to use a permanent magnet, and the other two methods are to use an electromagnet. Using an electromagnet is divided into two methods; that is, a method using a resistive electromagnet and a method using a conductive magnet. The method using a superconductive magnet is more generally used. The intensity of a magnetic field of an MRI apparatus used for a clinical trial is between approximately 0.06 T (Tesla) and approximately 2.0 T, and during a clinical trial, it is advantageous for a magnetic field to be maintain high uniformity.

The intensity of a permanent magnet used for an MRI apparatus is approximately 0.3 T, and is limited. However, a permanent magnet does not use power to maintain the intensity of a magnetic field and no power consumption is required, and therefore, no heat is generated and no cooling system is needed. In case of a resistive electromagnet, a coil or a group of coils that pass high voltage electric current are used, and therefore, power consumption is large. In order to obtain a uniform magnetic field, several para-magnetic coils need to be aligned geometrically. Since a large amount of heat is generated, a water-based cooling system is needed. The intensity of a resistive electromagnet used in general is between approximately 0.15 T and approximately 0.25 T. A superconductive magnet includes superconductive material that has no resistance to electric current, and the intensity of a magnetic field of a superconductive magnet used for an MRI apparatus is generally approximately 2.0 T.

On the other hand, an MRI apparatus further includes a shimming coil, and a shimming coil is configured to generate a uniform magnetic field and to compensate for non-uniformity of the main magnetic field. That is, no magnet generates a perfectly uniform intensity of a magnetic field at 100%, and therefore, a non-uniformity of a magnetic field is compensated by using one or more shimming coils. Accordingly, the shimming coil is disposed inside or outside the main magnet 110 and generates a weak magnetic field to compensate for a non-uniformity of a main magnetic field.

The gradient coil 120 generates a slanted magnetic field in the directions of X, Y, and Z for the spatial information of a magnetic resonance signal. That is, the gradient coil 120 obtains the spatial information by varying the frequencies of magnetic resonance signals according to spatial locations. Here, the gradient coil 120 generates a slanted magnetic field that changes in a linear manner in proportion to a three-dimensional, random direction in relation to the main magnetic field, and adds the slanted magnetic field to the main magnetic field. Accordingly, the frequency of a magnetic resonance signal increases or decreases in a linear manner in proportion to the intensity of the magnetic field. Therefore, if the information on the slope of a slanted magnetic field and the frequency of a magnetic resonance signal are obtained, the spatial information of the magnetic resonance signal is obtained through the proportional relationship between the slanted magnetic field and the distance.

A radio frequency pulse used to induce a resonance of an atomic nucleus is generated by a frequency synthesizer and is transferred to the radio frequency coil 130. The radio frequency pulse is subject to wavelength adjustment to select a resonant frequency (larmor frequency) used to excite an atomic nucleus, and the energy of the radio frequency pulse having been subject to wavelength adjustment is absorbed by the atomic nucleus. At this time, if the radio frequency pulse is not transmitted, the excited nucleus induces electric current at the radio frequency coil 130, thereby generating a weak radio frequency signal, that is, a magnetic resonance signal.

The radio frequency coil 130 of an MRI apparatus is mainly divided into two types of coils including a whole volume coil and a surface coil. The whole volume coil receives a magnetic resonance signal which is excited from a large sample tissue of a subject (a subject patient), and a surface coil receives a magnetic resonance signal which is excited from a small sample tissue of a subject (a subject patient) but has an extremely high signal to noise ratio (SNR). That is, the surface coil is a type of a reception antenna, and is used for generating MRI of an extremely small cross section of a subject (a subject patient) with superior signal reception when compared with other coils.

The MRI apparatus as described above including the main magnet 110, the gradient coil 120, and the radio frequency coil 130 is installed inside a shield room 150 configured to shut out outside electromagnetic waves. AN MRI is performed according to the radio frequency energy that is transmitted from the radio frequency coil 130 while a subject patient is laying on a support panel 140.

A method of MRI is as follows: an atomic nucleus is composed of protons and neutrons each having a magnetic moment and spin and therefore serves as a single, small magnet. In particular, MRI uses a significant amount of atomic nuclei of hydrogen because of easy accessibility and of high reception. Meanwhile, the level of reception from a signal obtained from an atomic nucleus is in proportion to a gyromagnetic ratio, and the gyromagnetic ratio is dependent to the shape and size of an atomic nucleus.

The axis of rotation of a revolving atomic nucleus is randomly arranged without a magnetic field; however, once a magnetic field is applied from outside, the axis of rotation of a revolving atomic nucleus is arranged in the direction of a magnetic field, and rotates around the axis of a magnetic field performing a precessional motion. The speed of the rotation varies depending on the type of the atomic nucleus and is in proportion to the intensity of an external magnetic field. By following the same method, as a subject (a subject patient) is placed in a strong magnetic field, the number of atomic nuclei performing a precessional motion rotating in the direction of an external magnetic field is slightly more than the number of atomic nucleus performing a precessional motion in the opposite direction of the external magnetic field, and therefore, a net magnetization is formed in the direction of an external magnetic field, and such is called a longitudinal magnetization.

When a radio frequency pulse is transmitted to an atomic nucleus which is magnetized under the external magnetic field, some of the atomic nuclei with a low level of energy absorb the energy of the radio frequency pulse and become excited as a result, and such is called a resonance phenomenon. Here, the frequency of a radio frequency pulse used is in accord with the rotation frequency of the precessional movement of the atomic nucleus, and such is called a larmor frequency. Each atomic nucleus has an individual resonant frequency, and such frequency varies depending on the intensity of an external magnetic field. For example, a resonant frequency of a hydro-atomic nucleus is approximately 6.4 Mhz at 0.15 T, and approximately 85.2 Mhz at 20 T.

When a radio frequency pulse is transmitted, an atomic nucleus at a equilibrium state is excited as a result, and the atomic nucleus returns to the equilibrium state while generating a magnetic resonance signal. In this case, the magnetic resonance signal is measured only on the xy surface which is perpendicular to the z-axis. That is, when a radio frequency pulse of 90° is transmitted to an atomic nucleus, some of the atomic nuclei with low energy status become excited and a net magnetization is formed in a horizontal direction on an xy surface which is 90° to the direction of a magnetic field. At this time, if a radio frequency pulse is shut off, the atomic nucleus with high level of energy discharges radio frequency energy and returns to the equilibrium state; such is called a relaxation. AN MRI apparatus, as explained above, uses the varying speed of relaxation of atomic nucleus in order to obtain an MRI.

In detail, after transmitting a radio frequency pulse of 90°, the net-magnetization is formed on the xy surface while rotating at 360°; at this time, the rotating phase and the rotating speed of all atomic nuclei are the same, and such is called an in-phase. The magnetic resonance signal discharged at the in-phase is at the highest. However, as times goes by, the atomic nuclei are affected by an uniformity of the magnetic field and the interaction between the atomic nuclei. Therefore, some atomic nuclei rotate at a faster speed while other atomic nuclei rotate at a slower speed, and eventually a de-phase state is achieved.

The magnetic resonance signal that is discharged throughout a de-phase state is drastically decreased, and such process is called T2. Here, a T2 relaxation time denotes a time for a net magnetization to decrease to 37% due to a de-phase process. However, T2 is not significantly affected by the intensity of an external magnetic field.

The atomic nuclei, which have been in an in-phase state, go through a de-phase process after shutting off a radio frequency pulse, and are rearranged to the direction of a magnetic field. At this time, the atomic nuclei reach an equilibrium state by giving energy to a lattice, and such a process is called T1. As time goes by, atomic nuclei are again magnetized to a Z direction, and the time for a net magnetization for the atomic nuclei to recover to 63% of its original magnitude is called T1 relaxation time. Here, the stronger an external magnetic field becomes, the longer the T1 relation time takes.

Figure 2:
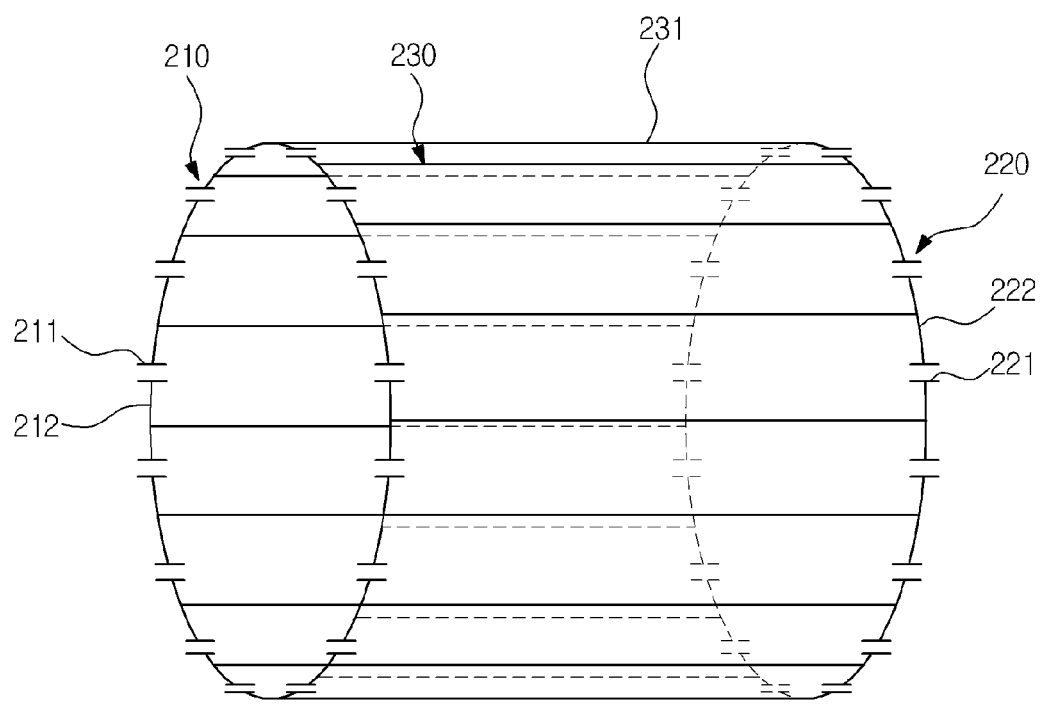
FIG. 2 is a perspective view schematically illustrating a wireless radio frequency coil for MRI according to an exemplary embodiment.

FIG. 2 is a perspective view schematically illustrating a wireless radio frequency coil for MRI according to an exemplary embodiment.

Referring to FIG. 2, a wireless radio frequency coil transmits or receives, or transmits and receives radio frequency signals without being connected physically to a main body of an MRI apparatus. Such a wireless radio frequency coil is divided into a number of large and small coils according to a portion of a subject (a subject patient), such as a head, a spine, an abdomen, hands, and feet.

A general radio frequency coil is connected physically to a main body of an MRI apparatus, and transmits and/or receives information or commands to control the operation of the radio frequency coil. For example, the general radio frequency coil may communicate driving signals to transmit a radio frequency signal; or may communicate magnetic resonance signals received from a subject (a subject patient). Herein, the terms "communicate" and "transmit/receive" and "transmit or receive" may include operations or transmit, receive, and/or transmit and receive. However, the wireless radio frequency coil according to the present exemplary embodiment communicates such signals, commands, and information through wireless communication with a main body of an MRI apparatus. FIG. 2 illustrates a schematic view of a radio frequency coil used to transmit and/or receive radio frequency signals. However, it should be noted that a wireless radio frequency coil for MRI according to an exemplary embodiment of the present disclosure includes, in addition to the radio frequency coil as illustrated on FIG. 2, a power supply unit, a switch, a sensor unit, and a control unit. More details of a structure of a wireless radio frequency coil for MRI will be explained with reference to FIG. 3.

The radio frequency coil illustrated in FIG. 2 is a bird-cage type radio frequency coil that may transmit/receive radio frequency signals. A bird-cage type radio frequency coil includes two ring-shaped conductors, a first ring-shaped conductor 210 and a second ring-shaped conductor 220 and a plurality of bar-type conductors 230. As for ring-shaped conductors 210 and 220, capacitances 211 and 221 and inductances 212 and 222 are placed in between the points of contacts made between ring-shaped conductors 210 and 220 and the plurality of bar-type conductors 230. That is, each portion of the ring type conductors 210 and 220 includes one capacitance and one inductance that are connected in serial, and the two ring-shaped conductors 210 and 220 construct a ring-shaped surface on a cylinder-shaped space that a radio frequency coil forms. Meanwhile, the bar-type conductors 230 construct the side surface on the cylinder-shaped space that a radio frequency coil forms.

FIG. 2 illustrates a cylinder-shaped radio frequency coil, but the present inventive concept is not limited thereto. The shape of a coil may vary depending on the portion of a subject (a subject patient) as to maximize the collection of MRI signals.

Figure 3:
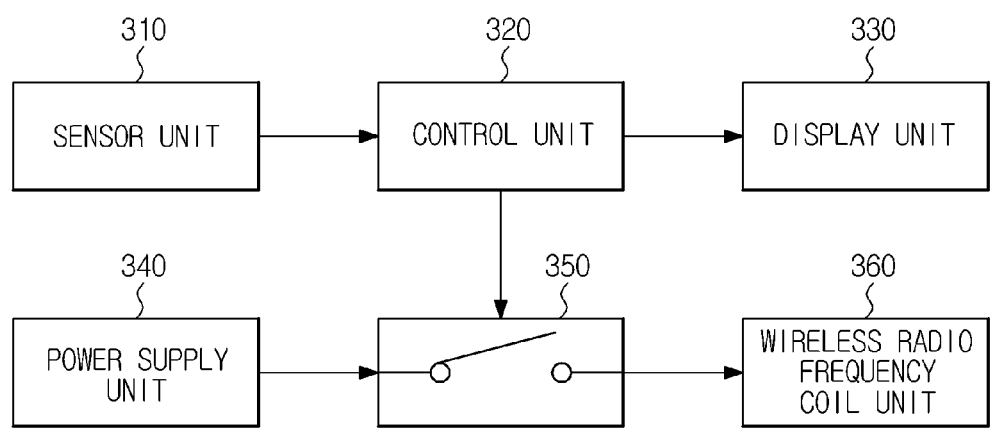
FIG. 3 is a block diagram schematically illustrating a structure of a wireless radio frequency coil for MRI according to an exemplary embodiment.

FIG. 3 is a block diagram schematically illustrating a structure of a wireless radio frequency coil for MRI according to an exemplary embodiment.

Referring to FIG. 3, a wireless radio frequency coil for MRI includes a wireless radio frequency coil unit 360 that transmits, receives, or transmits and receives radio frequency signals, a power supply unit 340 that provides a power voltage to operate the wireless radio frequency coil unit 360, a switch 350 that is connected to the wireless radio frequency coil unit 360 and the power supply unit 340, a sensor unit 310 that detects signals discharged from a space in which the wireless radio frequency coil unit 360 is located, a control unit 320 that controls overall operations of the wireless radio frequency coil, and a display unit 330 that displays the status of a power voltage provided.

The wireless frequency coil unit 360 receives magnetic resonance signals discharged from an atomic nucleus of a subject (a subject patient) placed in the interior space of a gantry of an MRI apparatus. Here, the wireless radio frequency unit 360 represents a radio frequency coil that transmits magnetic resonance signals received to the main body of the MRI apparatus without being connected physically to the main body of an MRI apparatus.

The wireless radio frequency coil unit 360 is different from a full body coil configured to transmit a radio frequency pulse to the full body of a subject while being installed inside a gantry of an MRI apparatus in that the wireless radio frequency coil unit 360 transmits, receives, or transmits and receives radio frequency signals of a particular portion of a subject (a subject patient).

The structure and shape of the wireless frequency coil unit 360 may vary in order to maximize the collection of magnetic resonance signals.

The power supply unit 340 is connected to the wireless radio frequency coil unit 360 through the switch 350 to supply a power voltage to operate the wireless radio frequency unit 360. That is, the power supply unit 340 is not directly connected to the wireless radio frequency coil unit 360 but is connected via the switch 350; therefore, the power voltage may be supplied or shut off depending on the status of the switch (on or off) to the wireless frequency coil unit 360.

Here, the power supply unit 340 includes at least one battery, and the power voltage supplied by the power supply unit 340 is provided to the wireless radio frequency coil unit 360 via a power supply terminal of the wireless radio frequency coil unit 360. In other words, the power supply unit 340 is electrically separated from the main body of the MRI apparatus, and supplies independently a power voltage to operate the wireless radio frequency coil unit 360.

The sensor unit 310 detects signals discharged from the space in which the wireless radio frequency coil unit 360 is located, and transmits a result of the signal detection to the control unit 320. As an example, the sensor unit 310 may detect an optical signal discharged from the space in which the wireless radio frequency coil unit 360 is located, and once detection is made, may transmit the result of optical signal detection to the control unit 320. For example, the optical signal that the sensor unit 310 detects may be a laser emitted by a laser transmission unit inside a gantry of the MRI apparatus. Here, the laser transmission unit may be installed inside a gantry and emit at least one laser beam toward a subject (a subject patient), so as to adjust the positional relationship between a subject and a main magnet inside a gantry.

In the case of detecting an optical signal from a laser, the sensor unit 310 may include an optical sensor that detects optical signals. Here, the sensor unit 310 may include an optical sensor that may detect ultraviolet rays, infrared rays, visible rays, x-rays, etc. That is, the optical signal detected by the optical sensor is not limited to laser signals. The optical sensor, depending on the method of detection, may include a photoelectron-emitting-type sensor, a photoconductive-type sensor, a junction-type sensor, etc. Also, in order to detect optical signals via an optical sensor, a plurality of optical sensors may be used that detect optical signals with particular waves.

As for another example, the sensor unit 310 may detect a magnetic field generated from the space in which the wireless radio frequency coil unit 360 is located, and once a detection is made, may transmit a result of the detection to the control unit 320. The magnetic field detected by the sensor unit 310 includes at least one of the following: a main magnetic field generated from the main magnet inside a gantry; a slanted magnetic field generated by the gradient coil; and a radio frequency pulse transmitted from the radio frequency coil. Here, the radio frequency pulse transmitted to excite an atomic nucleus is an electromagnetic wave including a magnetic field component. Accordingly, the sensor unit 310 detects the magnetic field component of the radio frequency pulse and transmits a result of the detection to the control unit 320.

The sensor unit 310 may be equipped with a magnetic sensor such as a hall sensor, a flux-gate sensor, a magneto-resistive sensor, etc that detect magnetic fields, but is not limited thereto. The sensor unit 310 may be implemented using a sensor that may detect a magnetic field of a particular intensity to detect a magnetic field of a threshold level of intensity formed around the wireless radio frequency coil unit 360. That is, various types of sensors may be used to form the sensor unit 310. In addition at least one sensor may be used to detect a magnetic field of a particular level of intensity depending on the intensity of the magnetic field that the sensor unit 310 is intended to detect.

For example, in case when a hall sensor is used, a magnetic field is detected by using a hall effect. Here, a hall effect denotes an occurrence of an electric field made when an electrical current flows in a perpendicular direction of a magnetic field inside a conductor in a magnetic field, in which the generated electric field is formed in a perpendicular direction to the magnetic field and the electric current. In general, the hall sensor may detect a magnetic field of a range about between approximately 0.01 mT and approximately 30 T, and provide a resolution of approximately 0.1 uT.

A flux-gate sensor uses a method to measure an external magnetic field based on a phenomenon that a hysteresis loop of a core becomes asymmetric when a magnetic field is applied on a core which has been subject to an alternating current magnetization. The flux-gate sensor may detect a magnetic field of a range of approximately 1 mT or below and provide a resolution of approximately 0.1 uT.

A magneto-resistive sensor detects a magnetic field by using an electromotive force induced on a coil with the magnetic flux variation according to time, and uses a detection coil and a fluxmeter serving as an integrator. In general, a magneto-resistive sensor detects a magnetic field of a range of between approximately 0.01 T and approximately 15 T and provides a resolution of approximately 10 nT.

In addition, the sensor unit 310 may detect various types of signals discharged from the space in which the wireless radio frequency coil unit 360 is located. Here, the sensor unit 310 may include various types of sensors that may detect a physical and/or chemical quantity, such as temperature, lights, sounds, pressures, distances, humidity, etc. that differentiates the internal space of a gantry from the external space of a gantry.

The wireless radio frequency coil unit for MRI according to an exemplary embodiment of the present disclosure may further include a power control unit (not shown) that is connected in between the power supply unit 340 and the wireless radio frequency coil unit 360. The power control unit controls a power voltage, which has been provided from the power supply unit 340, to be steady and supplies the controlled power voltage to the wireless radio frequency coil unit 360.

The control unit 320 controls overall operations of a wireless radio frequency coil. The control unit 320 controls the switch 350 according to a result of signal detection by the sensor unit 310 to supply or shut off a power voltage to operate the wireless radio frequency coil unit 360.

For example, the control unit 320 controls the switch 350 depending on the intensity of an optical signal, or more particularly, a laser, detected by the sensor unit 310. In such case, the control unit 320 shuts off the switch 350 if the intensity of a laser is equal to or greater than a threshold value. For example, the control unit 320 opens the switch 350 if the intensity of the laser is equal to or less than a threshold value.

In addition, the control unit 320 controls the switch 350, depending on the intensity of a magnetic field component of a radio frequency pulse, the intensity of a slanted magnetic field, or the intensity of a main magnetic field that is detected by the sensor unit 310. That is, the control unit 320 determines if the intensity of a main magnetic field is equal to or greater than a threshold value; and if the intensity is equal to or greater than the threshold value, the control unit 320 closes the switch 350 to supply a power voltage to the wireless radio frequency coil unit 360. In case that the intensity of a main magnetic field is less than a threshold value, the control unit 320 opens the switch 350 to shut off a power voltage supplied to the wireless radio frequency coil unit 360. The threshold for opening the switch 350 and the threshold for closing the switch 350 may be the same or may differ.

The intensity of a slanted magnetic field generated by a gradient coil varies depending on a space distinction. The control unit 320 detects the intensity of a slanted magnetic field during a predetermined period of time through the sensor unit 310 and calculates an average value of the intensity of slanted magnetic field. The controlling of the switch 350 using the average value of the slanted magnetic field is achieved in a similar manner to control the switch 350 as using the intensity of a main magnetic field.

As described above, the sensor unit 310 detects a magnetic field component of a radio frequency pulse transmitted from a radio frequency coil disposed in a gantry, and the control unit 320 controls the switch 350 after determining whether the intensity of the detected magnetic field component of a radio frequency pulse is equal to or greater than a threshold value. Here, the radio frequency pulse denotes a radio frequency pulse that is transmitted from a radio frequency coil disposed in the interior space of a gantry to scan the full body of a subject other than a radio frequency pulse transmitted by the wireless radio frequency coil unit 360.

In addition, the control unit 320 may distinguish the magnetic field component of a magnetic field of a radio frequency pulse, the magnetic field component of a slanted magnetic field, and the magnetic field component of a main magnetic field detected by the sensor unit. That is, the intensities of magnetic field components vary among a main magnetic field, a slanted magnetic field, and a magnetic field of a radio frequency pulse. The detection range and the resolution of the magnetic field detected also vary among a hall sensor, a flux-gate sensor, and a magneto-resistive sensor that may be provided in the sensor unit 310. For example, the control unit 320 may shut off a power voltage supplied to the wireless radio frequency coil unit 360 by opening the switch 350 in case no slanted magnetic field is detected while the main magnetic field is detected. In addition, the control unit 320 may supply a power voltage to the wireless radio frequency unit 360 by closing the switch 350 only when the magnetic field component of a radio frequency pulse is detected upon the start of MRI. In addition, the control unit 320 may supply a power voltage to the wireless radio frequency unit 360 only when all of the magnetic field component of a main magnetic field, the magnetic field component of a slated magnetic field and the magnetic field component of the magnetic field of a radio frequency pulse are detected.

The display unit 330 displays the status of a power voltage supplied to the wireless radio frequency coil unit 360. The status of a power voltage, for example, is displayed by turning on and off a lamp (a visual method) or generating an alarm sound (an auditory method).

With reference to a power voltage used to operate the sensor unit 310, the control unit 320, and the display unit 330, the present inventive concept is not particularly limited. However, the power supply unit 340 may supply a power voltage, or a supplemental source of power may be provided to operate the sensor unit 310, the control unit 320, and the display unit 330.

Figure 4:
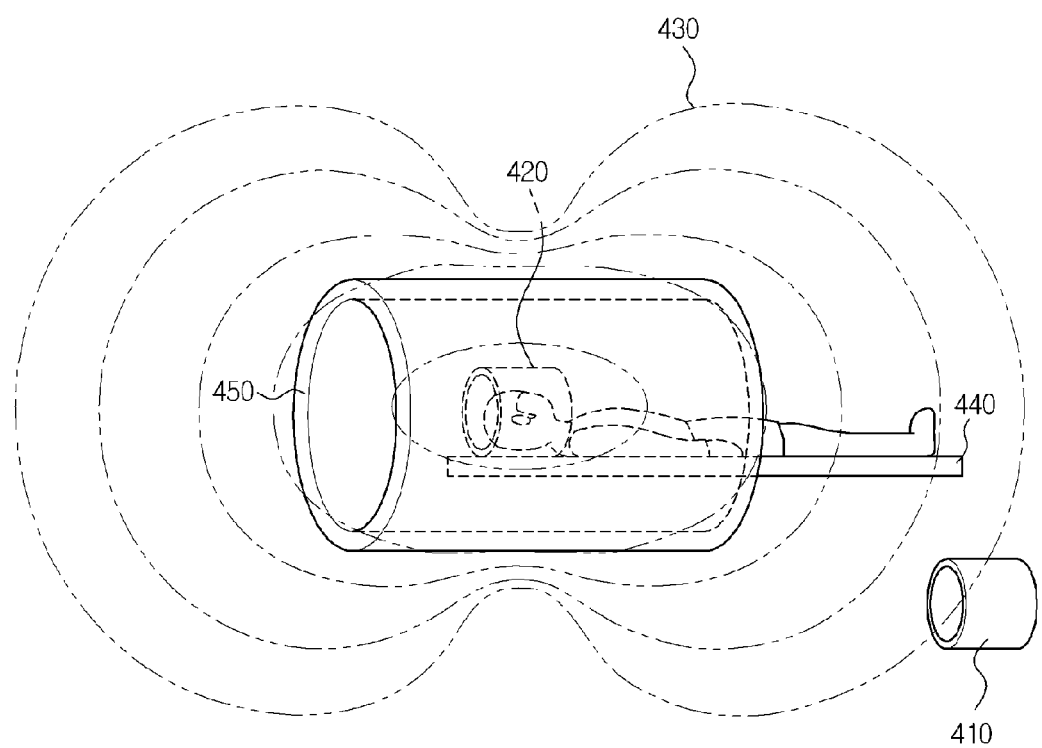
FIG. 4 is a view schematically illustrating a method of application of a structure of a wireless radio frequency coil for MRI according to an exemplary embodiment.

FIG. 4 is a view schematically illustrating a method of application of a structure of a wireless radio frequency coil for MRI according to an exemplary embodiment.

Referring to FIG. 4, signals used for an MRI apparatus are leaked around an MRI apparatus. For example, the signal may correspond to a magnetic field formed around an MRI apparatus. Here, a magnetic field 430 may be formed by one of the following: a main magnet, a gradient coil, or a radio frequency coil installed inside a gantry 450 of an MRI apparatus.

A wireless radio frequency coil 410 may be provided in a storage closet of a shield room before an MRI is taken. Here, the wireless radio frequency coil 410 denotes a radio frequency coil used to transmit, receive, or transmit and receive radio frequency signals with respect to a subject (a subject patient). In a case when the wireless radio frequency coil 410 is not in use, the wireless radio frequency coil 410 may be placed inside a storage closet of a shield room, or the wireless radio frequency coil 410 may be positioned beyond a certain distance from the center of an MRI apparatus. In such case (i.e., when the MRI apparatus is not in use), the sensor unit detects a leaking magnetic field from the MRI apparatus. However, since the intensity of the magnetic field detected is less than a threshold value, a power voltage is not supplied to a radio frequency coil unit of the MRI apparatus. Accordingly, the wireless radio frequency coil 410 is not turned on, and remains in an off status.

In case when a wireless radio frequency coil 420 is placed over a subject (a subject patient) lying on a support panel 440 to perform an MRI, a power voltage is automatically supplied to a wireless radio frequency coil unit and thus the wireless radio frequency coil 420 is turned on. That is, the intensity of a magnetic field detected inside the gantry 450 shows a significant difference when compared to that of the leaking magnetic field detected at the location of a storage closet or beyond a certain distance from the MRI apparatus. The control unit sets a threshold value in advance based on the difference found. Since the intensity of a magnetic field detected inside the gantry 450 is equal to or greater than the threshold value, the control unit controls a switch in order to supply a power voltage to operate the wireless radio frequency coil unit.

Also, during an MRI taking place, the wireless radio frequency coil 420 is being positioned inside the gantry 450, so the sensor unit continuously detects magnetic fields while the control unit maintains a turn-on status of the wireless radio frequency coil 420 according to the intensity of a magnetic field.

In a case after a completion of an MRI, when the wireless radio frequency coil 410 is placed in a storage closet after being removed from a subject, the intensity of a magnetic field detected by a sensor unit is less than a threshold value, and therefore, the control unit shuts off a power voltage supplied to a wireless radio frequency coil unit so that the wireless radio frequency coil 410 is turned off.

In FIG. 4, the wireless radio frequency coil 420 is shown as being applied inside the gantry 450. However, the application of the wireless radio frequency coil is not limited hereto. The wireless radio frequency coil may be applied, according to a pre-established threshold value of an intensity of a magnetic field, in relation to the outside of the gantry 450, the support panel 440 for a subject, or an area where a constant amount of intensity of magnetic field is present with reference to a center of an MRI apparatus.

Figure 5:
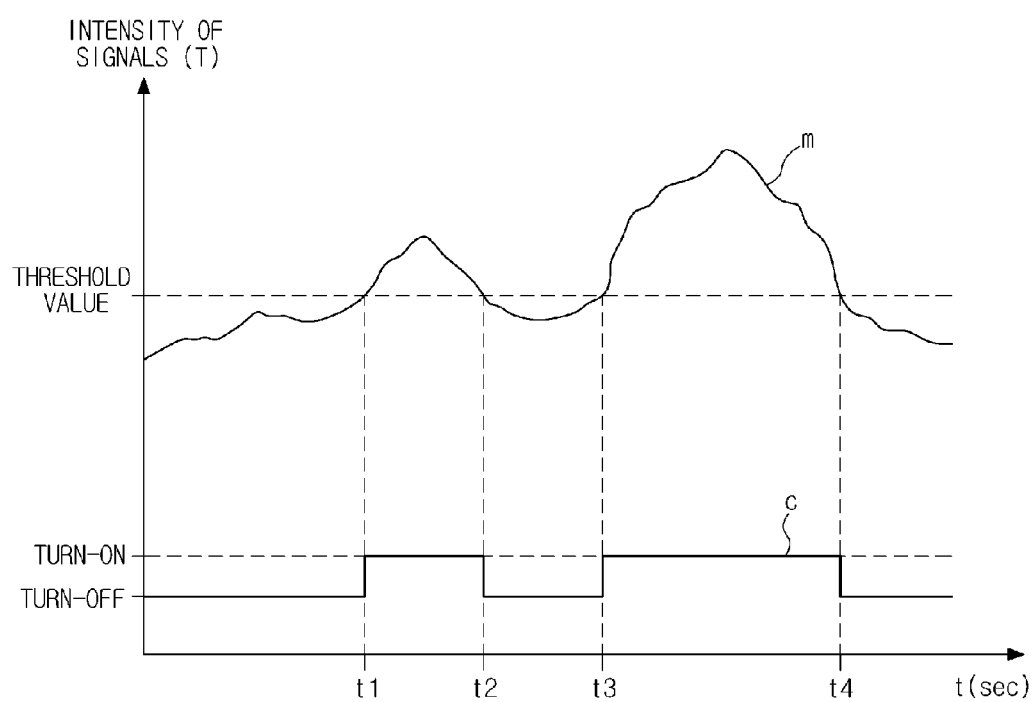
FIG. 5 is a graph schematically illustrating an operation of a wireless radio frequency coil for MRI according to an exemplary embodiment.

FIG. 5 is a graph schematically illustrating an operation of a wireless radio frequency coil for MRI according to an exemplary embodiment of the present disclosure.

Referring to FIG. 5, the operation of a wireless radio frequency coil for MRI according to an exemplary embodiment is described as follows. A curve (m) on the graph indicates the intensity of a detected signal by a sensor unit. Here, the signal detected by a sensor unit, as explained previously, may be a magnetic field that is formed around an MRI apparatus while the curve (m) indicates the intensity of the magnetic field. Alternatively, the curve (m) may indicate an optical signal detected by a sensor unit, indicating the intensity of a laser. Hereinafter the operation of a wireless radio frequency coil for MRI will be explained, on the assumption that the curve (m) is assumed to indicate a magnetic flux density of a magnetic field detected around a wireless radio frequency coil unit. The waveform (c) shown below the magnetic flux density curve denotes an on or off status of a wireless radio frequency coil.

Prior to t1 (time), the intensity of a magnetic field detected by a sensor unit is less than a threshold value, and a control unit controls a switch so that a wireless radio frequency coil is turned off.

During the time between t1 and t2, or the time t3 and t4, the intensity of a magnetic field detected by a sensor unit is equal to or greater than the threshold value, and thus a wireless radio frequency coil unit is supplied with a power voltage according to the control of the control unit, and the wireless radio frequency coil is turned on.

For all other timeframes, that is, the time between t2 and t3, or after t4, the wireless radio frequency coil is turned off, since the intensity of a magnetic field detected by the sensor unit is less than the threshold value.

Here, a wireless radio frequency coil being turned on or off represents the status that a power voltage is being supplied to a wireless radio frequency coil unit to transmit, receive, or transmit and receive radio frequency signals. In this case a control unit and a sensor unit of a wireless radio frequency coil, as explained previously, are provided with a power voltage aside from the power voltage supplied to the wireless radio frequency coil unit.

The curve (m), illustrated on the graph in FIG. 5, represents the intensity of a magnetic field detected by the sensor unit. However, as explained previously, in controlling the switch by use of the intensity of a slanted magnetic field generated by a gradient coil, the switch is controlled based on the average value of the intensity of the slanted magnetic field generated by the gradient coil during the period of time. Therefore, as illustrated in FIG. 5, the moment when the intensity of a magnetic field detected is greater or less than a threshold value, and the moment when a wireless radio frequency coil is turned on or off may be incoherent.

Figure 6:
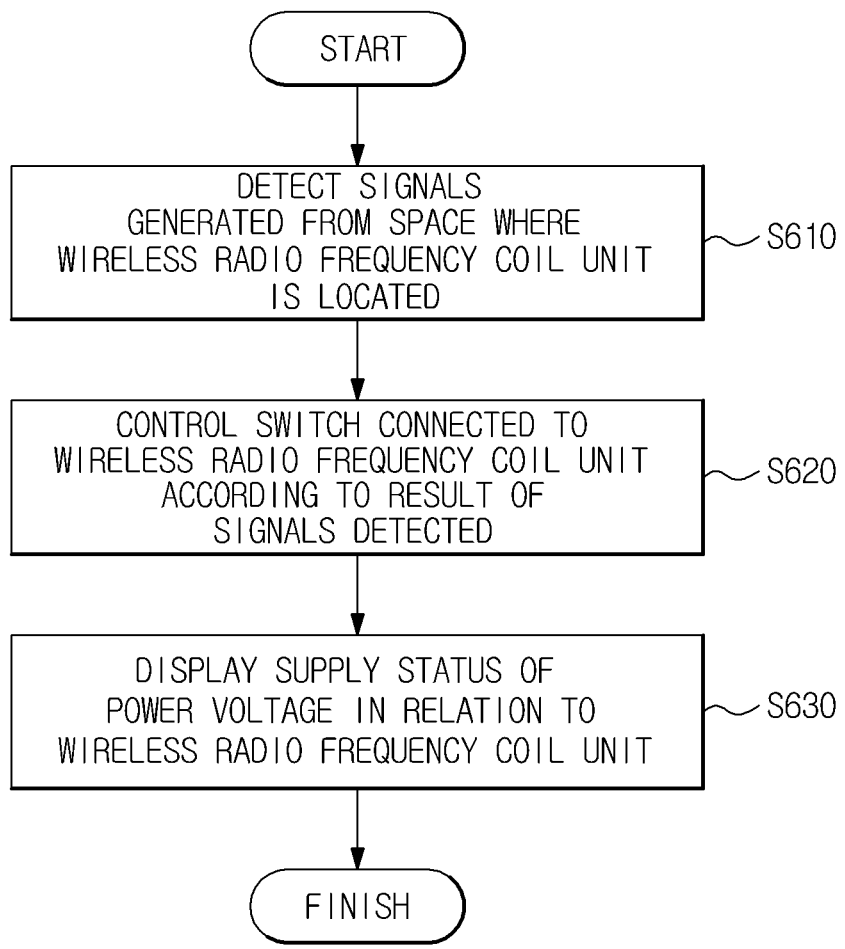
FIG. 6 is a flow chart schematically illustrating a method of controlling power of a wireless radio frequency coil for MRI according to an exemplary embodiment.

FIG. 6 is a flow chart schematically illustrating a method of controlling power of a wireless radio frequency coil for MRI according to an exemplary embodiment.

Referring to FIG. 6, signals discharged from the space where a wireless radio frequency coil unit is located are detected (S610). For example, a magnetic field generated from the space where a wireless radio frequency coil unit is located may be detected, and the magnetic field may include a main magnetic field generated by a main magnet, a slanted magnetic field generated by a gradient coil, or a radio frequency pulse transmitted from a radio frequency coil inside a gantry of an MRI apparatus.

As to detect a magnetic field generated around a wireless radio frequency coil unit, a hall sensor, a flux-gate sensor, or a magneto-resistive sensor, etc. may be used. In addition, since a detection range and a resolution of a magnetic field vary among the hall sensor, the flux-gate sensor and the magneto-resistive sensor, a sensor may be selected for use, depending on the type of magnetic field intended to detect.

A switch, which is connected to the wireless radio frequency coil unit, is controlled according to a result of signal detection (S620). As the switch is controlled to supply or shut off a power voltage needed to operate the wireless radio frequency coil unit. For example, a switch is closed as to supply a power voltage to the wireless radio frequency coil unit, only if the intensity of a magnetic field detected is equal to or greater than a threshold value. In the case when a magnetic field that changes depending on time and space is concerned, a switch may be controlled in a manner to detect the intensity of a magnetic field for a predetermined period of time to obtain the average value and then compare the average value with a threshold value. In a case that different magnetic fields are identified according to the intensity of each magnetic field, if a plurality of magnetic fields are detected, a switch may be operated when all three of the magnetic fields are detected to supply a power voltage to a wireless radio frequency coil unit.

In the case when a power voltage is supplied or shut off with respect to a wireless radio frequency coil unit, the status of a power voltage supplied is displayed (S630). A method to display a status of a power voltage supplied, as previously described, may be a visual method or an auditory method, etc.

The above described control method of a power voltage provided to a wireless radio frequency coil for MRI may be applied to a case when a laser is detected as an signal discharged in the interior space of a gantry.

Figure 7:
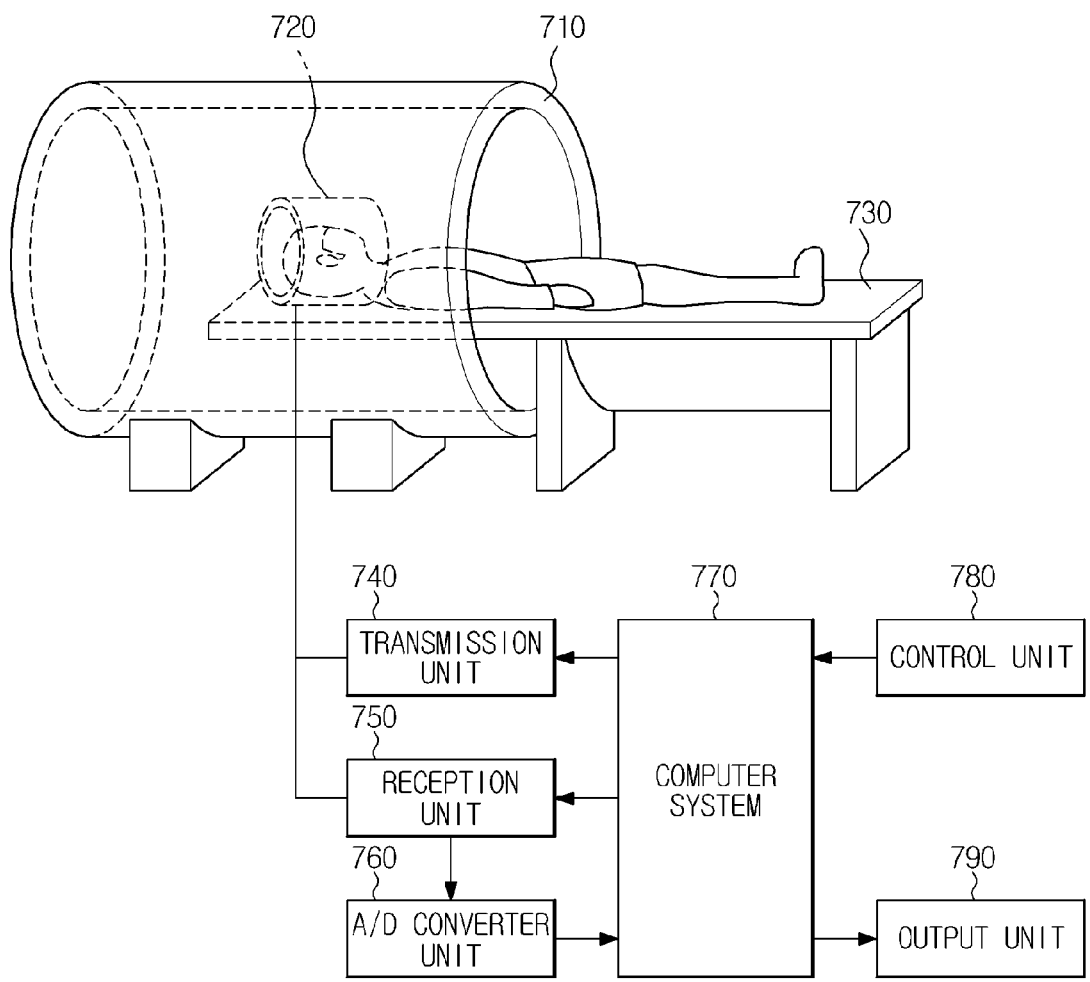
FIG. 7 is a block diagram schematically illustrating a structure of a magnetic resonance imaging apparatus using a wireless radio frequency coil for MRI according to an exemplary embodiment.

FIG. 7 is a block diagram schematically illustrating a structure of a magnetic resonance imaging apparatus using a wireless radio frequency coil for MRI according to an exemplary embodiment.

Referring to FIG. 7, an MRI apparatus includes a wireless radio frequency coil 720 which transmits, receives, or transmits and receives radio frequency signals, a gantry 710 including a main magnet, a gradient coil and a radio frequency coil, a transmission unit 740 which transmits driving signals to the wireless radio frequency coil 720, a reception unit 750 which receives radio frequency signals from the wireless radio frequency coil 720, an analog-to-digital (A/D) converter unit 760 which converts signals from the reception unit 750 into digital signals, a computer system 770 which generates an MRI, a control unit 780 which enters commands or information, and an output unit 790 which outputs an MRI.

The wireless radio frequency coil 720 includes a wireless radio frequency unit, a power supply unit, a switch, a sensor unit, and a control unit. The wireless radio frequency coil unit transmits, receives, or transmits and receives radio frequency signals. The power supply unit supplies a power voltage to operate a wireless radio frequency coil unit. The switch is placed and connected between the power supply unit and the wireless radio frequency coil unit, and the sensor unit detects signals discharged from the space in which the wireless radio frequency coil unit is located. The control unit controls the switch according to a result of signal detected by the sensor unit to supply or shut off a power voltage to operate the wireless radio frequency coil unit.

A line that connects the wireless radio frequency coil 720, the transmission unit 740, and the reception unit 750 is illustrated in FIG. 7, However, the line illustrated in FIG. 7 is provided only to illustrate the relationship among the wireless radio frequency coil 720, the transmission unit 740, and the reception unit 750. That is, the wireless radio frequency coil 720, the transmission unit 740, and the reception unit 750 are connected wirelessly, and no physical cable is present.

Inside the gantry 710, the main magnet, the gradient coil, and the radio frequency coil are present. The main magnet forms a main magnetic field inside the gantry 710. The gradient coil forms a slanted magnetic field at an inside space of the gantry 710. The radio frequency coil transmits a radio frequency pulse inside the space of the gantry 720.

The transmission unit 740 is controlled by the computer system 770, and transmits a driving signal to drive the wireless radio frequency coil 720 so that the wireless radio frequency coil 720 transmits radio frequency signals to a subject (a subject patient). Here, a subject may represent body portions of a patient lying down on a support panel 730 including a head, a spine, an abdomen, or hands and feet, etc.

The reception unit 750 receives wireless radio frequency signals, which are obtained by the wireless radio frequency coil 720 from a subject, that is, magnetic resonance signals generated from an atomic nucleus, and transmits signals to the A/D converter unit 760.

The A/D converter unit 760 receives signals from the reception unit 750, and converts the radio frequency signals into digital signals, and then transmits the digital signals to the computer system 770.

The computer system 770 controls overall activities of the transmission unit 740, the reception unit 750, and the A/D converter unit 760, receives digital signals from an A/D converter unit 760 and generates MRI on the basis of the digital signals received. The computer system 770 performs a Fourier Transformation on the digital signals received, thereby generating an MRI. The computer system 770 controls the operation of the wireless radio frequency coil 720 supplied with a power voltage while controlling a transmission of radio frequency signals so that magnetic resonance signals may be discharged from the atomic nucleus of a subject (a subject patient).

A user of an MRI apparatus enters control commands or information through the control unit 780 to control the transmission unit 740, the reception unit 750, and the A/D converter unit 760. The output unit 790 outputs the information of the operations of an MRI apparatus or MRI generated by a computer system 770.

Here, the wireless radio frequency coil 720 may further include a display unit to display the status of a power voltage supplied to the wireless frequency coil unit. However, the status of a power voltage may be included in the information on the operation of an MRI apparatus output by the output unit 790. That is, the wireless radio frequency coil 720 may communicate with the MRI apparatus via wireless, and therefore, the wireless radio frequency coil 720 sends to the reception unit 750 of the MRI apparatus the information on the supply of a power voltage in relation to the wireless radio frequency coil unit. The reception unit 750 may receive the status on the power voltage supplied to the wireless radio frequency coil before receiving a wireless radio frequency signal, and output information about the status on the power voltage to the output unit 790. Meanwhile when the supply of a power voltage to the wireless radio frequency coil unit is shut off after the reception unit 750 receives a wireless radio frequency signal and the computer system 770 generates an MRI, the output unit 790 outputs such status information.

According to the above-mentioned exemplary embodiments, a wireless radio frequency coil is automatically turned on and off according to a result obtained by detecting the signals discharged from the space in which the radio frequency coil is located. Therefore, a user's convenience, without having to operate a mechanical switch at a time of using a wireless radio frequency coil, is enhanced. Also, a result of not being able to obtain MRI, due to a user forgetting to turn on a mechanical switch of a wireless radio frequency coil, can be prevented.

Although a few exemplary embodiments of the present inventive concept have been shown and described, it will be appreciated by those skilled in the art that changes may be made in these exemplary embodiments without departing from the principles and spirit of the inventive concept, the scope of which is defined in the claims and their equivalents.

What is claimed is:

1. A wireless radio frequency coil for magnetic resonance imaging (MRI), the wireless radio frequency coil comprising:
   a wireless radio frequency coil unit configured to transmit, receive, or transmit and receive a radio frequency signal;
   a power supply unit configured to provide a power voltage for operation of the wireless radio frequency coil unit;
   a switch connected to the power supply unit and the wireless radio frequency coil unit;
   a sensor unit configured to detect signals discharged from a space in which the wireless radio frequency coil unit is located; and
   a control unit configured to provide or shut off the power voltage to the wireless radio frequency coil unit by controlling the switch according to a result obtained from the sensor unit,
   wherein the sensor unit comprises an optical sensor configured to detect a laser that is emitted from a laser transmission unit located in an interior space of a gantry of an MRI apparatus to adjust a positional relationship between a subject and a main magnet inside the gantry.

2. The wireless radio frequency coil of claim 1, wherein the sensor unit comprises the optical sensor configured to detect optical signals.

3. The wireless radio frequency coil of claim 1, wherein the control unit controls the switch based on a result of determining whether an intensity of the laser detected by the sensor unit is equal to or greater than a threshold value.

4. The wireless radio frequency coil of claim 1, wherein the sensor unit further comprises a magnetic sensor configured to detect at least one of a main magnetic field generated by the main magnet, a gradient magnetic field generated by a gradient coil, and a radio frequency pulse transmitted from the wireless radio frequency coil.

5. The wireless radio frequency coil of claim 4, wherein the sensor unit detects the main magnetic field that is generated by the main magnet located in the interior space of the gantry of the MRI apparatus.

6. The wireless radio frequency coil of claim 5, wherein the control unit controls the switch based on a result of determining whether an intensity of the main magnetic field detected by the sensor unit is greater than a threshold value.

7. The wireless radio frequency coil of claim 4, wherein the sensor unit detects a slanted magnetic field generated by a gradient coil located in the interior space of the gantry of the MRI apparatus.

8. The wireless radio frequency coil of claim 7, wherein the control unit controls the switch according to an average value of intensities of the slanted magnetic fields detected by the sensor unit during a period of time.

9. The wireless radio frequency coil of claim 8, wherein the control unit controls the switch based on a result of determining whether the average value of the intensities of the slanted magnetic fields is equal to or greater than a threshold value.

10. The wireless radio frequency coil of claim 4, wherein the sensor unit detects a magnetic field component of a radio frequency pulse transmitted from a radio frequency coil located in the interior space of the gantry of the MRI apparatus.

11. The wireless radio frequency coil of claim 10, wherein the control unit controls the switch based on a result of determining whether an intensity of the magnetic field component of the radio frequency pulse detected by the sensor unit is equal to or greater than a threshold value.

12. The wireless radio frequency coil of claim 1, further comprising a display unit configured to display a status of the power voltage provided to the wireless radio frequency coil unit.

13. The wireless radio frequency coil of claim 1, further comprising a power control unit which is connected between the wireless radio frequency coil unit and the power supply unit to control the power voltage provided from the power supply unit at a steady rate and to provide the controlled power voltage to the wireless frequency coil unit.

14. A method of controlling a power of a wireless radio frequency coil for magnetic resonance imaging (MRI) comprising a wireless radio frequency coil unit configured to transmit, receive, or transmit and receive a radio frequency signal, a power supply unit configured to provide a power voltage for operation of the wireless radio frequency coil unit, a switch connected to the power supply unit and the wireless radio frequency coil unit, and a sensor unit configured to detect signals discharged from a space in which the wireless radio frequency coil unit is located, the method comprising:
   detecting signals discharged from a space in which the wireless radio frequency coil unit is located using an optical sensor configured to detect a laser that is emitted from a laser transmission unit located in an interior space of a gantry of an MRI apparatus to adjust a positional relationship between a subject and a main magnet inside the gantry; and providing or shutting off the power voltage for operation of the wireless radio frequency coil unit by controlling the switch according to a result of the detecting.

15. The method of claim 14, wherein the sensor unit comprises the optical sensor, and the signals are detected by detecting a laser using the optical sensor.

16. The method of claim 14, wherein the providing or shutting off the power voltage comprises providing or shutting off the power voltage for operation of the wireless radio frequency coil unit by controlling the switch according a result of determining whether an intensity of the detected laser is equal to or greater than a threshold value.

17. The method of claim 14, wherein the sensor unit further comprises a magnetic sensor that is configured to detect at least one of a main magnetic field generated by the main magnet, a gradient magnetic field generated by a gradient coil, and a radio frequency pulse transmitted from the wireless radio frequency coil.

18. The method of claim 17, wherein detecting the signals comprises detecting a main magnetic field, which is generated by a main magnet located in the interior space of the gantry of the MRI apparatus.

19. The method of claim 18, wherein the providing or shutting off the power voltage comprises providing or shutting off the power voltage for operation of the wireless radio frequency coil unit by controlling the switch according a result of determining whether an intensity of the detected main magnetic field is equal to or greater than a threshold value.

20. The method of claim 17, wherein detecting the signals comprises detecting a slanted magnetic field, which is generated by a gradient coil located in the interior space of the gantry of the MRI apparatus.

21. The method of claim 20, wherein the providing or shutting off the power voltage comprises providing or shutting off the power voltage for operation of the wireless radio frequency coil unit by controlling the switch according to a result of determining an average value of intensities of the slanted magnetic fields detected during a period of time.

22. The method of claim 21, wherein the providing or shutting off the power voltage comprises providing or shutting off the power voltage for operation of the wireless radio frequency coil unit by controlling the switch according a result of determining whether the average value of the intensities of the slanted magnetic fields is equal to or greater than a threshold value.

23. The method of claim 17, wherein detecting the signals comprises detecting a magnetic field component of a radio frequency pulse transmitted from a radio frequency coil located in the interior space of the gantry of the MRI apparatus.

24. The method of claim 23, wherein the providing or shutting off the power voltage comprises providing or shutting off the power voltage for operation of the wireless radio frequency coil unit by controlling the switch according a result of determining whether an intensity of the detected magnetic field component of the radio frequency pulse is equal to or greater than a threshold value.

25. The method of claim 14, further comprising displaying a status of the power voltage provided to the wireless radio frequency coil unit.

26. A magnetic resonance imaging (MRI) apparatus comprising:
a wireless radio frequency coil comprising:
a wireless radio frequency coil unit configured to transmit, receive, or transmit and receive a radio frequency signal;
a power supply unit configured to provide a power voltage for operation of the wireless radio frequency coil unit;
a switch connected to the power supply unit and the wireless radio frequency coil unit;
a sensor unit configured to detect signals discharged from a space in which the wireless radio frequency coil unit is located; and
a control unit configured to provide or shut off the power voltage by controlling the switch according to a result obtained from the sensor unit;
a computer system configured to form a magnetic resonance image based on a radio frequency signal which is received by the wireless radio frequency coil; and
an output unit configured to output the magnetic resonance image formed by the computer system and information about an operation of the MRI apparatus,
wherein the sensor unit comprises an optical sensor is configured to detect a laser that is emitted from a laser transmission unit located in an interior space of a gantry of the MRI apparatus to adjust a positional relationship between a subject and a main magnet inside the gantry.

27. The MRI apparatus of claim 26, wherein the information about the operation of the MRI apparatus comprises status of the power voltage provided to the wireless radio frequency coil unit.

28. A magnetic resonance imaging (MRI) apparatus comprising:
a gantry comprising a main magnet, a gradient coil, and a radio frequency coil that produce magnetic fields for imaging a subject patient; and
a wireless radio frequency coil comprising:
a wireless radio frequency coil unit configured to transmit, receive or transmit and receive a radio frequency communication signal;
a power supply unit configured to provide a power voltage for operation of the wireless radio frequency coil unit;
a switch connected to the power supply unit and the wireless radio frequency coil unit;
a sensor unit configured to detect one or more of the magnetic fields discharged from the gantry; and
a control unit configured to automatically provide or shut off the power voltage by controlling the switch according to a result obtained from the sensor unit,
wherein the sensor unit comprises an optical sensor configured to detect a laser that is emitted from a laser transmission unit located in an interior space of the gantry of the MRI apparatus to adjust a positional relationship between a subject and the main magnet inside the gantry.

29. The MRI apparatus of claim 28, wherein the wireless radio frequency coil is provided within the gantry.

30. The MRI apparatus of claim 28, wherein the wireless radio frequency coil is provided outside the gantry.

31. The MRI apparatus of claim 26, wherein the sensor unit further comprises:
a magnetic sensor configured to detect at least one of a main magnetic field generated by the main magnet, a gradient magnetic field generated by a gradient coil, and a radio frequency pulse transmitted from the wireless radio frequency coil.

32. The MRI apparatus of claim 28, wherein the sensor unit further comprises:
a magnetic sensor that is configured to detect at least one of a main magnetic field generated by the main magnet, a gradient magnetic field generated by the gradient coil, and a radio frequency pulse transmitted from the radio frequency coil.

* * * * *